United States Patent
Liu et al.

(10) Patent No.: US 11,876,302 B2
(45) Date of Patent: Jan. 16, 2024

(54) PHASE COMPENSATION METHOD AND APPARATUS FOR MEASURING ARRAY ANTENNA

(71) Applicant: KUANG-CHI INSTITUTE OF ADVANCED TECHNOLOGY, Nanshan District Shenzhen (CN)

(72) Inventors: RuoPeng Liu, Nanshan District Shenzhen (CN); Zhiya Zhao, Nanshan District Shenzhen (CN); Hua Tian, Nanshan District Shenzhen (CN); Jie Yao, Nanshan District Shenzhen (CN)

(73) Assignee: KUANG-CHI INSTITUTE OF ADVANCED TECHNOLOGY, Guangdong (CN)

(*) Notice: Subject to any disclaimer, the term of this patent is extended or adjusted under 35 U.S.C. 154(b) by 567 days.

(21) Appl. No.: 17/093,083

(22) Filed: Nov. 9, 2020

(65) Prior Publication Data

US 2021/0057816 A1    Feb. 25, 2021

Related U.S. Application Data

(63) Continuation of application No. PCT/CN2018/124558, filed on Dec. 28, 2018.

(30) Foreign Application Priority Data

May 8, 2018    (CN) .......................... 201810432530.1

(51) Int. Cl.
*H01Q 3/38* (2006.01)
*H01Q 3/40* (2006.01)
(Continued)

(52) U.S. Cl.
CPC .......... *H01Q 3/38* (2013.01); *G01R 29/0871* (2013.01); *H01Q 3/267* (2013.01); *H01Q 3/40* (2013.01)

(58) Field of Classification Search
CPC ............ H01Q 3/38; H01Q 3/267; H01Q 3/40; H01Q 21/0087; H01Q 23/00; G01R 29/0871; G01R 29/10
See application file for complete search history.

(56) References Cited

U.S. PATENT DOCUMENTS

| | | | |
|---|---|---|---|
| 5,276,452 A | 1/1994 | Schuss et al. | |
| 2015/0134281 A1* | 5/2015 | Kitajima | G01R 31/66 702/62 |
| 2016/0091542 A1* | 3/2016 | Kitajima | G01R 29/18 702/60 |

FOREIGN PATENT DOCUMENTS

| | | |
|---|---|---|
| CN | 106093898 A | 11/2016 |
| CN | 106199220 A | 12/2016 |

(Continued)

OTHER PUBLICATIONS

International Search Report for corresponding PCT/CN2018/124558 dated Mar. 14, 2019, 2 pages.

*Primary Examiner* — Christopher P McAndrew
*Assistant Examiner* — Zannatul Ferdous
(74) *Attorney, Agent, or Firm* — Armstrong Teasdale LLP

(57) ABSTRACT

The present disclosure provides a phase compensation method and apparatus for measuring an array antenna. The phase compensation method includes: an operation S1 of exporting measured far-field directivity patterns of a first array unit and a second array unit, to establish a coordinate system, so as to determine a spatial geometrical relationship between the first array unit and the second array unit; an operation S2 of determining a wave path difference between the first array unit and the second array unit based on the spatial geometrical relationship between the first array unit and the second array unit; and an operation S3 of performing phase compensation on the second array unit based on the wave path difference.

14 Claims, 9 Drawing Sheets

(51) Int. Cl.
    *G01R 29/08*     (2006.01)
    *H01Q 3/26*     (2006.01)

(56) References Cited

FOREIGN PATENT DOCUMENTS

| | | |
|---|---|---|
| CN | 106291129 A | 1/2017 |
| JP | 2014163716 A | 9/2014 |

\* cited by examiner

PHASE COMPENSATION METHOD AND APPARATUS FOR MEASURING ARRAY ANTENNA

CROSS-REFERENCE TO RELATED APPLICATIONS

The present application is a continuation of International Patent Application No. PCT/CN2018/0124558, filed on Dec. 28, 2018, which claims the benefit of priority to Chinese Patent Application No. 201810432530.1, filed on May 8, 2018, the contents of which are hereby incorporated by reference in their entirety.

TECHNICAL FIELD

The present disclosure relates to the field of antennas, and specifically, to a phase compensation method and apparatus for measuring an array antenna.

BACKGROUND

In a process of measuring an array antenna and a radome thereof, an array unit deflects from a rotation center of a rotary table, thereby easily causing an error in a measured far-field directivity pattern. A phase error is relatively sensitive. If no preprocessing (phase compensation) is performed on a measured phase, a beam directivity deviation may easily occur when beam synthesis is performed on an obtained far field of each array unit, thereby affecting test accuracy of a wave transmittance and other electrical performance indicators.

However, in existing measurement, the foregoing error is usually ignored, or a position of an entire antenna is adjusted so that the antenna is located in a rotation center of a rotary table during a single-antenna test. Therefore, the existing measurement has an disadvantage such as low test efficiency, complex test tooling, or an inherent test error.

For the problems in the related art, no effective solution is currently proposed.

SUMMARY

For the problems in the related art, the present disclosure provides a phase compensation method and apparatus for measuring an array antenna, so that after phase compensation and port zero-calibration are performed on each array unit, an additional beam directivity error can be avoided, so as to improve electrical performance test accuracy of a radome.

The technical solutions in the present disclosure are implemented as follows:

According to an aspect of the present disclosure, a phase compensation method for measuring an array antenna is provided, where the array antenna includes a first array unit and a second array unit.

The phase compensation method includes: an operation S1 of exporting measured far-field directivity patterns of the first array unit and the second array unit, to establish a coordinate system, so as to determine a spatial geometrical relationship between the first array unit and the second array unit; an operation S2 of determining a wave path difference between the first array unit and the second array unit based on the spatial geometrical relationship between the first array unit and the second array unit; and an operation S3 of performing phase compensation on the second array unit based on the wave path difference.

According to an embodiment of the present disclosure, the operation S1 includes: an operation S11 of exporting the measured far-field directivity patterns of the first array unit and the second array unit, to establish the coordinate system, where the coordinate system is represented by using (x, y, z); an operation S12 of establishing a first coordinate system, using the first array unit as an origin O, defining coordinates (x0, y0, z0) of the origin O, and defining a beam directivity (φ, θ) of the array antenna, where the defining a beam directivity (φ, θ) of the array antenna includes: in the coordinate system (x, y, z), an included angle between a projection of the beam directivity of the array antenna on an xy plane and a positive direction of an x-axis is an angle φ, and an included angle between the beam directivity of the array antenna and an xz plane is an angle θ; and an operation S13 of establishing a second coordinate system, using the second array unit as another point O1 in a coordinate axis, and defining coordinates (x1, y1, z1) of the another point O1.

According to an embodiment of the present disclosure, the operation S2 includes: an operation S21 of marking a vertical line from the another point O1 to a direction of the beam directivity of the array antenna, and obtaining an intersection point M between the vertical line and a direction line of the beam directivity of the array antenna, to determine the wave path difference OM in the direction of the beam directivity of the array antenna; and an operation S22 of calculating the wave path difference OM based on a vertical relationship between the vector OM and a vector O1M.

According to an embodiment of the present disclosure, before the operation S1, the phase compensation method includes: predetermining a phase $\phi_2$ of the second array unit; and the operation S3 includes: substituting the wave path difference OM and the phase $\phi_2$ of the second array unit into a phase compensation formula, to determine a phase $\phi_1$ of the first array unit, where the phase compensation formula is as follows:

$$\phi_1 = \phi_2 + 360 * \frac{r}{\lambda},$$

where r indicates the wave path difference, and λ indicates a wavelength.

According to an embodiment of the present disclosure, the phase compensation method further includes: deflecting the first array unit to a position of the second array unit, setting a deflected first array unit as a third array unit, and performing phase compensation on the third array unit, to obtain the phase of the first array unit by performing phase inversion on the third array unit.

According to an embodiment of the present disclosure, the phase compensation method further includes: deflecting the second array unit to a position of the first array unit, setting a deflected second array unit as a fourth array unit, and performing phase compensation on the fourth array unit, to obtain the phase of the second array unit by performing phase inversion on the fourth array unit.

According to an embodiment of the present disclosure, the phase compensation method further includes: connecting each array unit to an electronic switch, and controlling each array unit based on the electronic switch, to sequentially test a far field of each array unit.

According to another aspect of the present disclosure, a phase compensation apparatus for measuring an array antenna is provided, where the array antenna includes a first array unit and a second array unit.

The phase compensation apparatus for measuring an array antenna includes: a first determining module, configured to: export measured far-field directivity patterns of the first array unit and the second array unit, to establish a coordinate system, so as to determine a spatial geometrical relationship between the first array unit and the second array unit; a second determining module, configured to: determine a wave path difference between the first array unit and the second array unit based on the spatial geometrical relationship between the first array unit and the second array unit; and a phase compensation module, configured to: perform phase compensation on the second array unit based on the wave path difference.

According to an embodiment of the present disclosure, the phase compensation apparatus further includes: a first deflection and inversion module, configured to: deflect the first array unit to a position of the second array unit, set a deflected first array unit as a third array unit, and perform phase compensation on the third array unit, to obtain a phase of the first array unit by performing phase inversion on the third array unit.

According to an embodiment of the present disclosure, the phase compensation apparatus further includes: a second deflection and inversion module, configured to: deflect the second array unit to a position of the first array unit, set a deflected second array unit as a fourth array unit, and perform phase compensation on the fourth array unit, to obtain a phase of the second array unit by performing phase inversion on the fourth array unit.

A beneficial effect of the present disclosure lies in:

In the present disclosure, the measured far-field directivity patterns of the first array unit and the second array unit are exported, to establish the coordinate system, so as to determine the spatial geometrical relationship between the first array unit and the second array unit; then the wave path difference between the first array unit and the second array unit is determined based on the spatial geometrical relationship between the first array unit and the second array unit; and finally, phase compensation is performed on the second array unit based on the wave path difference. Therefore, after phase compensation and port zero-calibration are performed on each array unit, an additional beam directivity error can be avoided, so as to improve electrical performance test accuracy of a radome.

BRIEF DESCRIPTION OF DRAWINGS

To describe the technical solutions in the embodiments of the present disclosure or in the related art more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly and completely describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure shall fall within the protection scope of the present disclosure.

According to an embodiment of the present disclosure, a phase compensation method for measuring an array antenna is provided, where the array antenna includes a first array unit and a second array unit.

Figure 1:
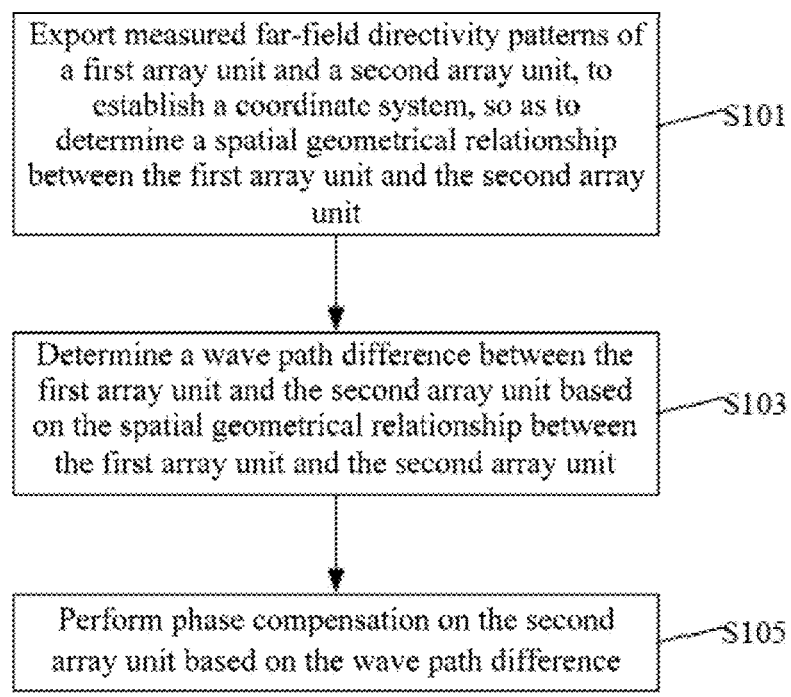
FIG. 1 is a flowchart of a phase compensation method for measuring an array antenna according to an embodiment of the present disclosure.

As shown in FIG. 1, the phase compensation method according to this embodiment of the present disclosure includes the following operations S101, S103 and S105. In the operation S101, measured far-field directivity patterns of the first array unit and the second array unit are exported to establish a coordinate system, so as to determine a spatial geometrical relationship between the first array unit and the second array unit. In the operation S103, a wave path difference between the first array unit and the second array unit is determined based on the spatial geometrical relationship between the first array unit and the second array unit. In the operation S105, phase compensation is performed on the second array unit based on the wave path difference.

According to the foregoing solution in the present disclosure, the measured far-field directivity patterns of the first array unit and the second array unit are exported, to establish the coordinate system, so as to determine the spatial geometrical relationship between the first array unit and the second array unit; then the wave path difference between the first array unit and the second array unit is determined based on the spatial geometrical relationship between the first array unit and the second array unit; and finally, phase compensation is performed on the second array unit based on the wave path difference. Therefore, after phase compensation and port zero-calibration are performed on each array unit, an additional beam directivity error can be avoided, so as to improve electrical performance test accuracy of a radome To better understood the technical solutions in the present disclosure, the following gives detailed description by using specific embodiments.

The present disclosure discloses a phase compensation method for measuring an array antenna. The phase compensation method includes the following operations S1, S2 and S3. In the operation S1, measured far-field directivity patterns of a first array unit and a second array unit are exported to establish a coordinate system, so as to determine a spatial geometrical relationship between the first array unit and the second array unit.

Figure 2:
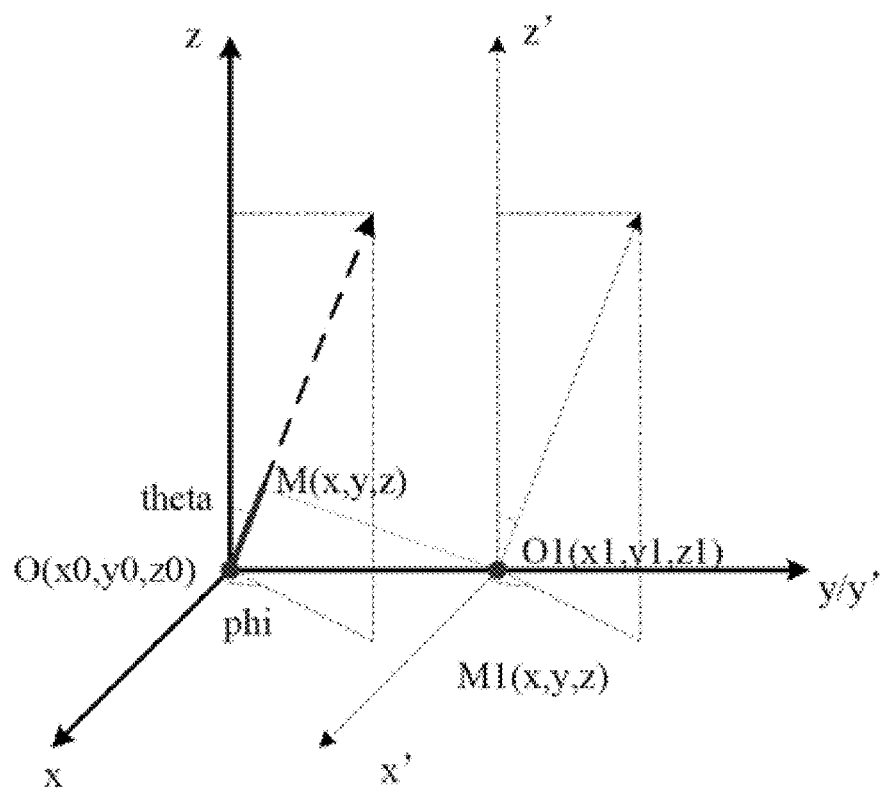
FIG. 2 is a schematic diagram of a far-field directivity pattern according to an embodiment of the present disclosure.

In the operation S1, the operation S1 includes the following operations S11, S12 and S13. In the operation S11, the measured far-field directivity patterns of the first array unit and the second array unit are exported to establish the coordinate system, where the coordinate system is represented by using (x, y, z). In the operation S12, a first coordinate system is established, the first array unit is used as an origin O, coordinates (x0, y0, z0) of the origin O are defined, and a beam directivity ($\varphi$, $\theta$) of the array antenna is defined, where the defining a beam directivity ($\varphi$, $\theta$) of the array antenna includes: in the coordinate system (x, y, z), an included angle between a projection of the beam directivity of the array antenna on an xy plane and a positive direction of an x-axis is an angle $\varphi$, and an included angle between the beam directivity of the array antenna and an xz plane is an angle $\theta$. In the operation S13, a second coordinate system is established, the second array unit is used as another point O1 in a coordinate axis, and coordinates (x1, y1, z1) of the another point O1 is defined. Details are as follows:

As shown in FIG. 2, the measured far-field directivity patterns of the first array unit and the second array unit are exported, to establish the coordinate system. A coordinate system of the first array unit is represented by using (x, y, z). In the coordinate system (x, y, z), an included angle between a projection of a direction OM of the beam directivity of the array antenna on the xy plane and the positive direction of the x-axis is an azimuth angle $\varphi$ (or phi), and an included angle between the direction OM of the beam directivity of the array antenna and a straight line oz is an elevation angle $\theta$ (theta). In addition, a coordinate system of the second array unit is represented by using (x', y', z'), and an origin of the coordinate system (x', y', z') is defined as O1.

In the operation S2, a wave path difference between the first array unit and the second array unit is determined based on the spatial geometrical relationship between the first array unit and the second array unit.

The operation S2 includes the following operations S21 and S22. In the operation S21, a vertical line from the another point O1 to the direction of the beam directivity of the array antenna is marked, and an intersection point M between the vertical line and a direction line of the beam directivity of the array antenna is obtained, to determine the wave path difference OM in the direction of the beam directivity of the array antenna. In the operation S22, the wave path difference OM is calculated based on a vertical relationship between the vector OM and a vector O1M. Details are as follows:

Still referring to FIG. 2, the vertical line O1M is marked from the point O1 to the direction OM of the beam directivity of the array antenna, and the intersection point between the vertical line O1M and the direction OM of the beam directivity of the array antenna is M. In addition, it can be determined based on a geometrical position relationship that a triangle OO1M is a right triangle. The relationship is represented as vector $OM^\perp$ vector O1M by using vectors. The wave path difference OM is obtained based on the geometrical position relationship. Details are as follows:

The foregoing vectors may be determined based on the following coordinates, that is, the vector OM=(x−x0, y−y0, z−z0), and the vector $O_1M$=(x−x1, y−y1, z−z1).

In addition, the following may be determined based on the geometrical relationship:

$$OM \perp O_1M \Rightarrow OM \cdot O_1M = 0;$$

$$\Rightarrow (x - x0) \cdot (x - x1) + (y - y0) \cdot (y - y1) + (z - z0) \cdot (z - z1) = 0;$$

further, $$\begin{cases} x = x0 + r \cdot \sin\theta \cdot \cos\varphi \\ y = y0 + r \cdot \sin\theta \cdot \sin\varphi \\ z = z0 + r \cdot \cos\theta \end{cases};$$

$$\Rightarrow r \cdot \sin\theta \cdot \cos\varphi \cdot (x0 - x1 + r \cdot \sin\theta \cdot \cos\varphi) + r \cdot \sin\theta \cdot \sin\varphi \cdot$$
$$(y0 - y1 + r \cdot \sin\theta \cdot \sin\varphi) +$$
$$r \cdot \cos\theta \cdot (z0 - z1 + r\cos\theta) = 0;$$

$$\Rightarrow (\sin^2\theta \cdot \cos^2\varphi + \sin^2\theta \cdot \sin^2\varphi + \cos^2\theta) \cdot r^2 + [(x0 - x1) \cdot \sin\theta \cdot \cos\varphi +$$
$$(y0 - y1) \cdot \sin\theta \cdot \sin\varphi +$$
$$(z0 - z1) \cdot \cos\theta] \cdot r = 0;$$

$$\Rightarrow r = -\frac{b}{a} \text{ or } r = 0 \text{ (truncated)},$$

where $$\begin{cases} a = (\sin^2\theta \cdot \cos^2\varphi + \sin^2\theta \cdot \sin^2\varphi + \cos^2\theta) \\ b = [(x0 - x1) \cdot \sin\theta \cdot \cos\varphi + (y0 - y1) \cdot \sin\theta \cdot \sin\varphi + (z0 - z1) \cdot \cos\theta]. \end{cases}$$

Therefore, the wave path difference OM may be obtained based on the foregoing formulas. After the wave path difference OM is calculated, path different compensation is performed on a phase of the second array unit.

In the operation S3, phase compensation is performed on the second array unit based on the wave path difference.

In addition, before the operation S1, the phase compensation method includes: predetermining a phase $\phi_2$ of the second array unit; and the operation S3 includes: substituting the wave path difference OM and the phase $\phi_2$ of the second array unit into a phase compensation formula, to determine a phase $\phi_1$ of the first array unit, where the phase compensation formula is as follows:

$$\phi_1 = \phi_2 + 360 * \frac{r}{\lambda},$$

where r indicates the wave path difference, and $\lambda$ indicates a wavelength.

In this embodiment, conditions for the phase compensation include: 1. An antenna 1 (or the first array unit) is placed at O, and an antenna 2 (or the second array unit) is placed at O1. 2. Far-field exporting is performed with reference to a coordinate system origin (0, 0, 0). In addition, in a phase compensation process, a phase $\phi_1$ (or a phase 0) of the antenna 1, a phase $\phi_2$ (or a phase 1) of the antenna 2, and spatial coordinates of the origin O and the another point O1 further need to be known. Therefore, calculation is performed based on the following formula:

$$\phi_1 = \phi_2 + 360 * \frac{r}{\lambda}$$

(or Phase 0 = phase 1 + 360 * r/lamda), where r indicates a wave path difference, and $\lambda$ indicates a wavelength.

Then verification is performed: The phase 0 of the antenna 1 is obtained based on the phase 1 and the spatial coordinates of O and O1.

In addition, the phase compensation method further includes: deflecting the first array unit to a position of the second array unit, setting a deflected first array unit as a third array unit, and performing phase compensation on the third array unit, to obtain the phase of the first array unit by performing phase inversion on the third array unit.

Figure 3:
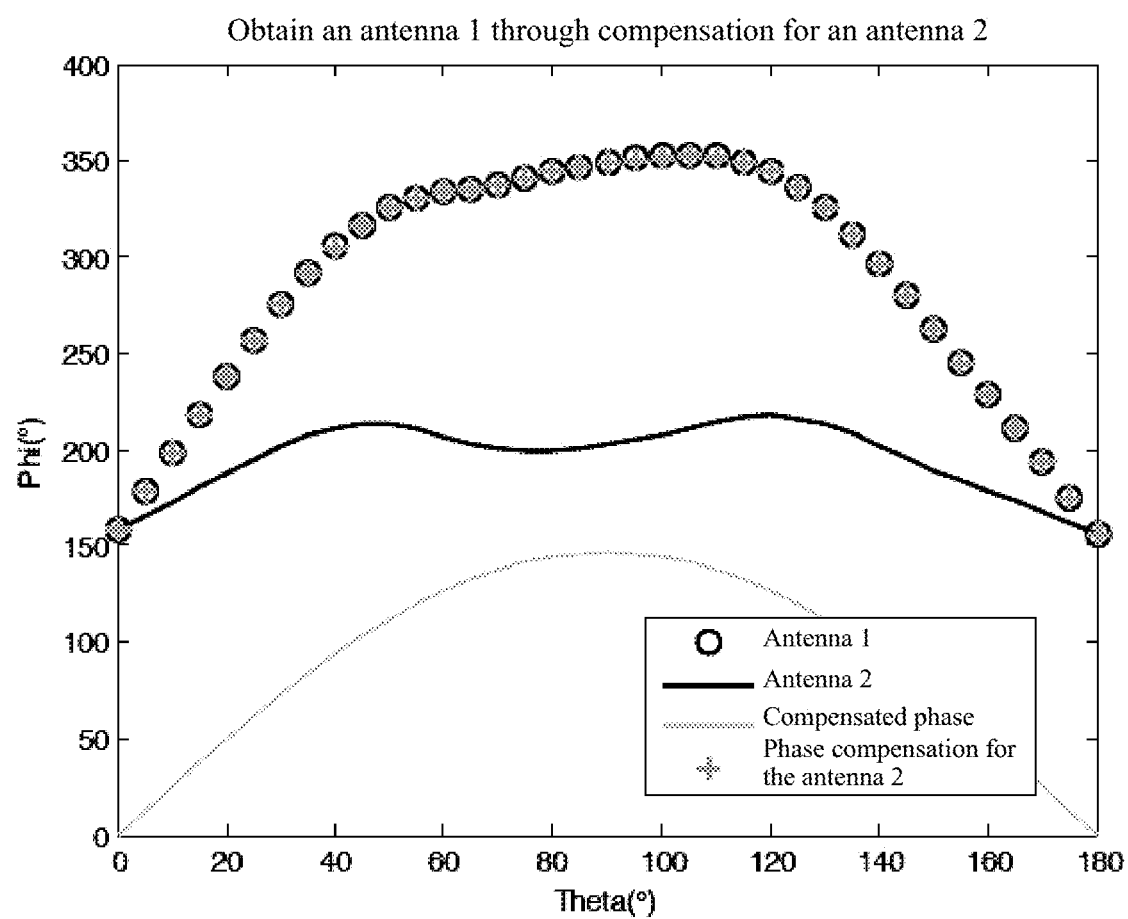
FIG. 3 is a schematic diagram of one-dimensional phase comparison according to a first embodiment of the present disclosure.
Figure 4:
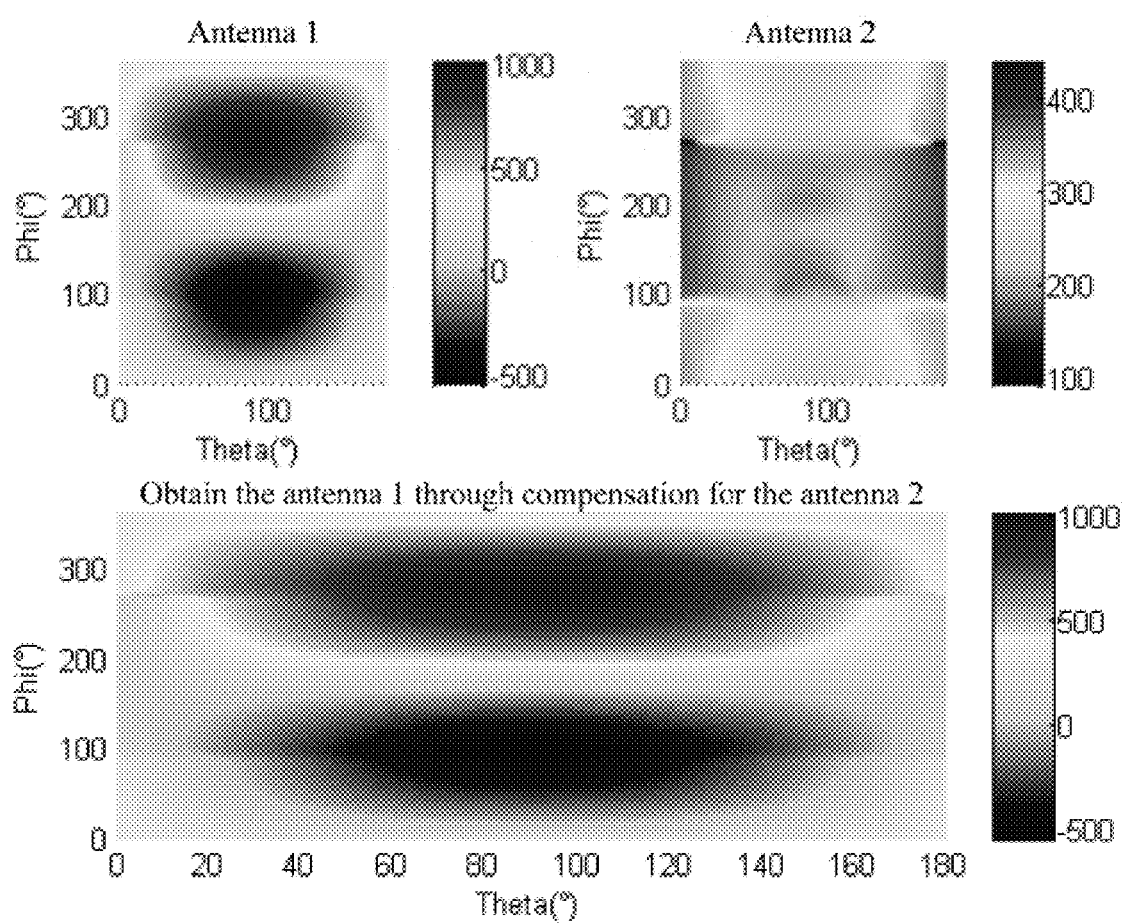
FIG. 4 is a schematic diagram of two-dimensional phase comparison according to a first embodiment of the present disclosure.
Figure 5:
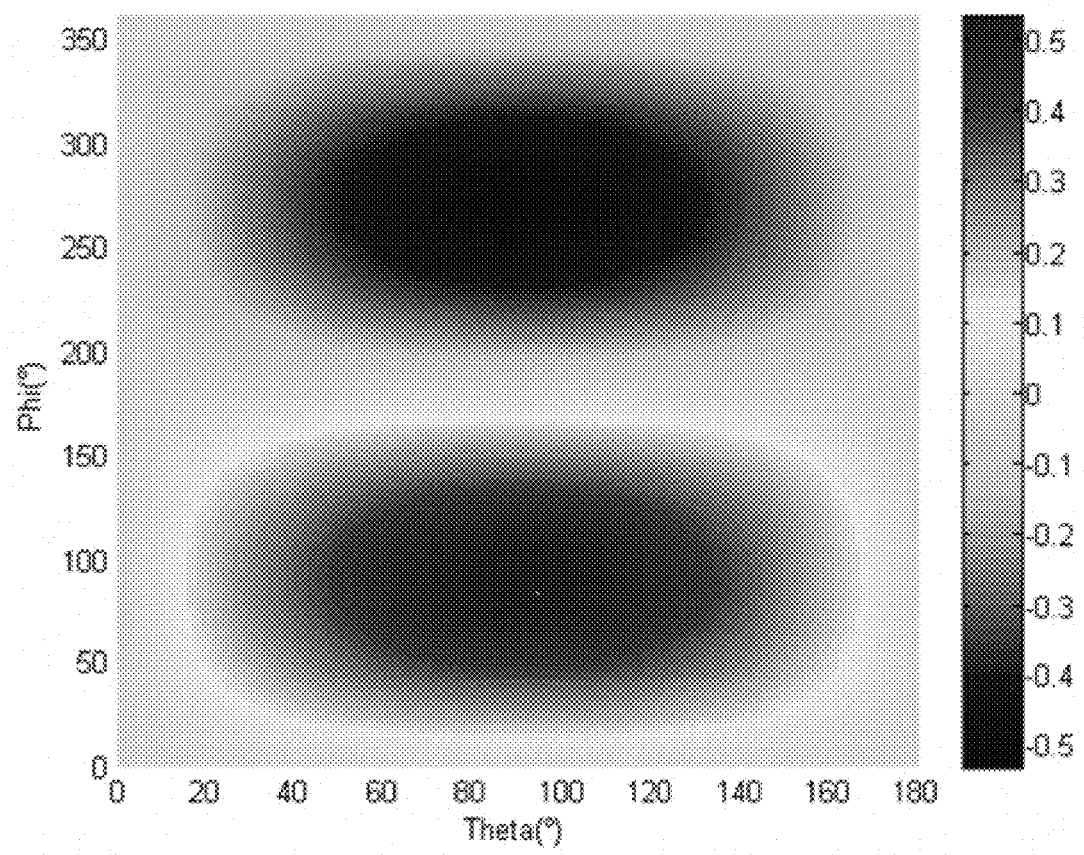
FIG. 5 is a schematic diagram of a phase compensation error according to a first embodiment of the present disclosure.

In this embodiment, a simulation verification process is performed on the phase compensation. Still referring to FIG. 2, an antenna 1 is located at (0, 0, 0), the antenna 1 is deflected to (0, 100, 0) to obtain an antenna 2, and phase compensation is performed on a phase of the antenna 2. A compensation result is shown in FIG. 3, FIG. 4, and FIG. 5.

In addition, the phase compensation method further includes: deflecting the second array unit to a position of the first array unit, setting a deflected second array unit as a fourth array unit, and performing phase compensation on the fourth array unit, to obtain the phase of the second array unit by performing phase inversion on the fourth array unit.

Figure 6:
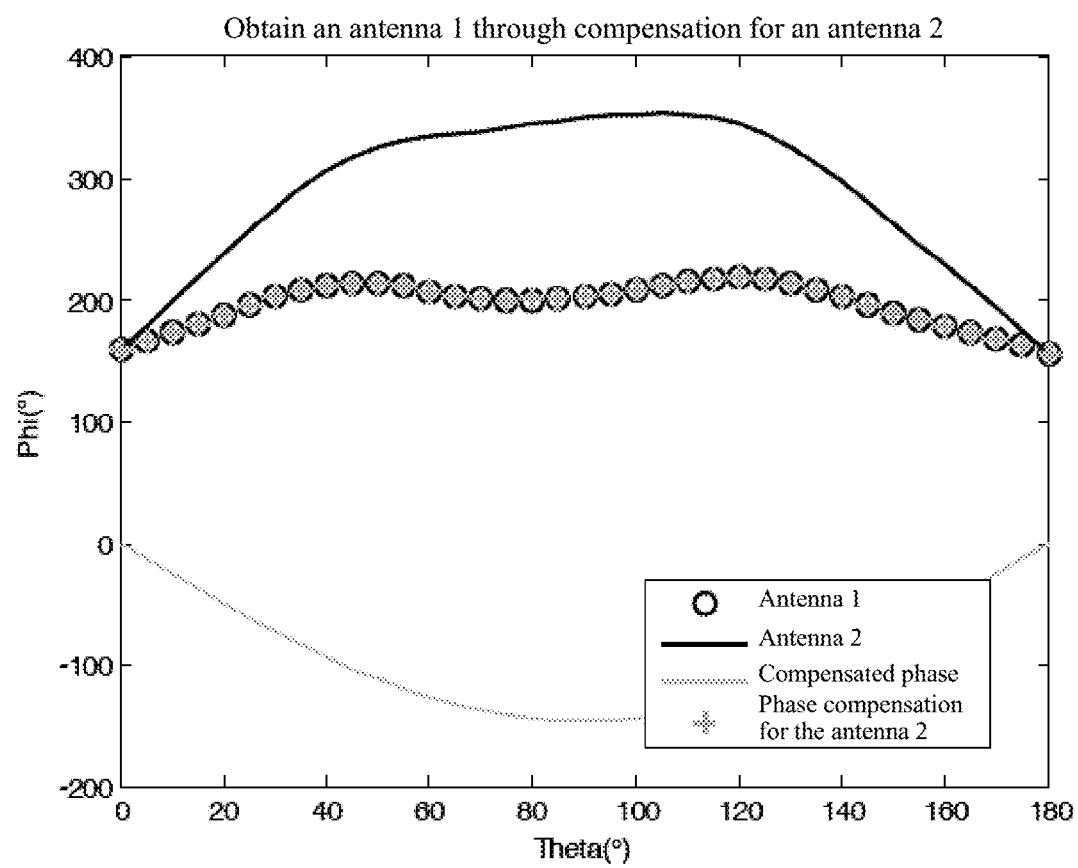
FIG. 6 is a schematic diagram of one-dimensional phase comparison according to a second embodiment of the present disclosure.
Figure 7:
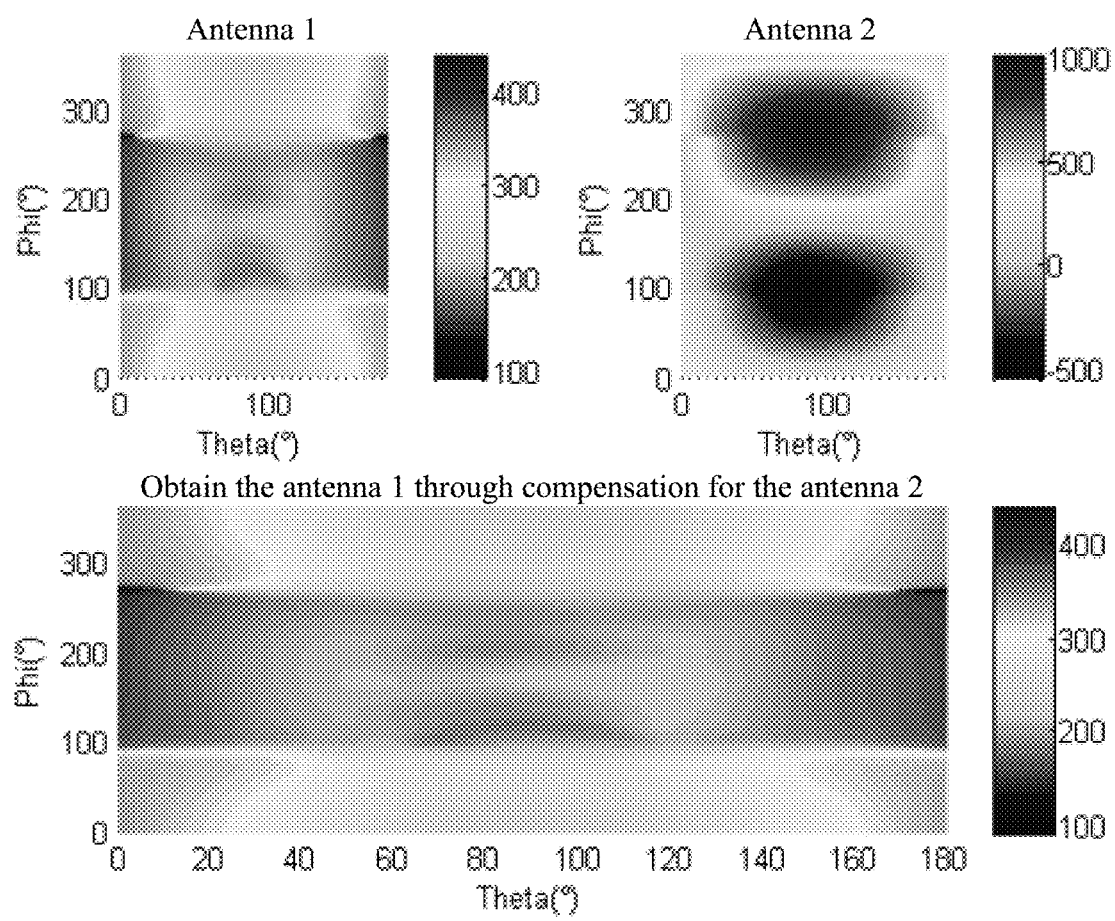
FIG. 7 is a schematic diagram of two-dimensional phase comparison according to a second embodiment of the present disclosure.
Figure 8:
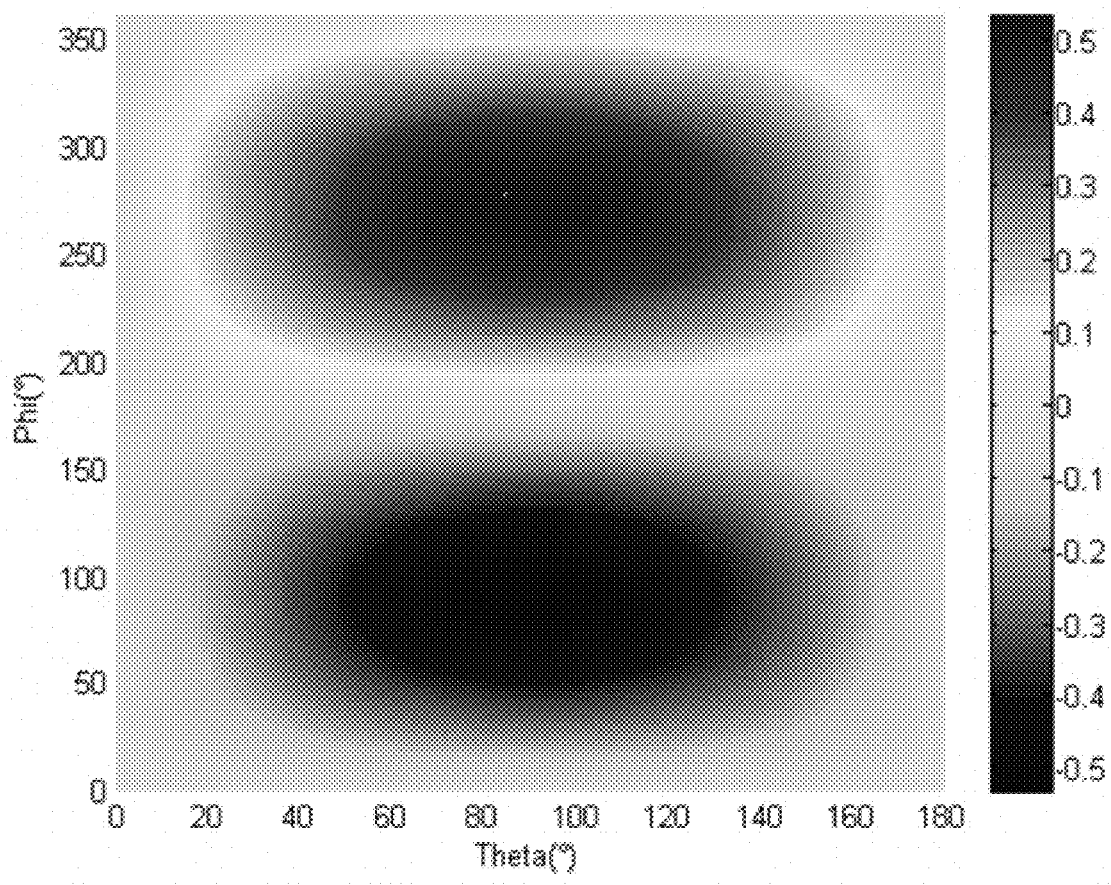
FIG. 8 is a schematic diagram of a phase compensation error according to a second embodiment of the present disclosure.

In this embodiment, an inverse verification process is performed on the phase compensation. Still referring to FIG. 2, an antenna 1 is located at (0, 100, 0), the antenna 1 is deflected to (0, 0, 0) to obtain an antenna 2, and phase compensation is performed on a phase of the antenna 2. A compensation result is shown in FIG. 6, FIG. 7, and FIG. 8.

In addition, the phase compensation method further includes: connecting each array unit to an electronic switch, and controlling each array unit based on the electronic switch, to sequentially test a far field of each array unit. Therefore, each array unit is connected to the electronic switch, to sequentially test the far field of each array unit, without a need of moving the antenna and then fixing the antenna, thereby improving test efficiency.

According to another aspect of the present disclosure, a phase compensation apparatus for measuring an array antenna is provided, where the array antenna includes a first array unit and a second array unit.

Figure 9:
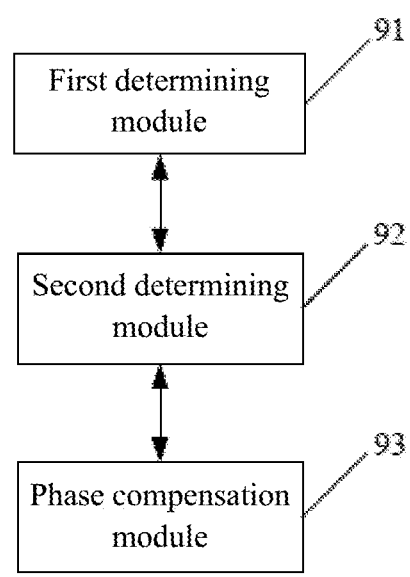
FIG. 9 is a block diagram of a phase compensation apparatus for measuring an array antenna according to an embodiment of the present disclosure.

As shown in FIG. 9, the phase compensation apparatus for measuring an array antenna includes: a first determining module 91, configured to: export measured far-field directivity patterns of the first array unit and the second array unit, to establish a coordinate system, so as to determine a spatial geometrical relationship between the first array unit and the second array unit; a second determining module 92, configured to: determine a wave path difference between the first array unit and the second array unit based on the spatial geometrical relationship between the first array unit and the second array unit; and a phase compensation module 93, configured to: perform phase compensation on the second array unit based on the wave path difference.

According to an embodiment of the present disclosure, the phase compensation apparatus 93 further includes: a first deflection and inversion module (not shown), configured to: deflect the first array unit to a position of the second array unit, set a deflected first array unit as a third array unit, and perform phase compensation on the third array unit, to obtain a phase of the first array unit by performing phase inversion on the third array unit.

According to an embodiment of the present disclosure, the phase compensation apparatus 93 further includes: a second deflection and inversion module (not shown), configured to: deflect the second array unit to a position of the first array unit, set a deflected second array unit as a fourth array unit, and perform phase compensation on the fourth array unit, to obtain a phase of the second array unit by performing phase inversion on the fourth array unit.

In addition, although only the first determining module 91, the second determining module 92, the phase compensation module 93, the first deflection and inversion module, and the second deflection and inversion module are specified in the phase compensation apparatus, a person skilled in the art can certainly understand that other modules corresponding to the phase compensation method are also applicable to the phase compensation apparatus in the present disclosure. For example, according to an embodiment of the present disclosure, the phase compensation apparatus further includes: a connection unit, configured to: connect each array unit to an electronic switch, and control each array unit based on the electronic switch, to sequentially test a far field of each array unit. Therefore, each array unit is connected to the electronic switch, to sequentially test the far field of each array unit, without a need of moving the antenna and then fixing the antenna, thereby improving test efficiency. This is not limited in the present disclosure.

To sum up, according to the foregoing technical solutions in the present disclosure, the measured far-field directivity patterns of the first array unit and the second array unit are exported, to establish the coordinate system, so as to determine the spatial geometrical relationship between the first array unit and the second array unit; then the wave path difference between the first array unit and the second array unit is determined based on the spatial geometrical relationship between the first array unit and the second array unit; and finally, phase compensation is performed on the second array unit based on the wave path difference. Therefore, after phase compensation and port zero-calibration are performed on each array unit, an additional beam directivity error can be avoided, so as to improve electrical performance test accuracy of a radome.

The foregoing are merely preferred embodiments of the present disclosure, but are not intended to limit the present disclosure. Any modification, equivalent replacement, or improvement made within the spirit and principle of the present disclosure shall fall within the protection scope of the present disclosure.

What is claimed is:

1. A phase compensation method for measuring an array antenna, wherein the array antenna comprises a first array unit and a second array unit, and the phase compensation method comprises following operations performed by a phase compensation apparatus:
    an operation S1 of controlling to measure the first array unit and the second array unit, which are placed on a rotary table, so as to obtain measured far-field directivity patterns of the first array unit and the second array unit, and establishing a coordinate system based on the far-field directivity patterns, so as to determine a spatial geometrical relationship between the first array unit and the second array unit;
    an operation S2 of determining a wave path difference between the first array unit and the second array unit based on the spatial geometrical relationship between the first array unit and the second array unit; and
    an operation S3 of performing phase compensation on the second array unit based on the wave path difference, so as to compensate a beam directivity deviation introduced to the measured far-field directivity patterns when at least one of the first array unit and the second array unit deflects from a rotation center of the rotary table.

2. The phase compensation method according to claim 1, wherein the operation S1 comprises:
an operation S11 of exporting the measured far-field directivity patterns of the first array unit and the second array unit, to establish the coordinate system, wherein the coordinate system is represented by using (x, y, z);
an operation S12 of establishing a first coordinate system, using the first array unit as an origin O, defining coordinates (x0, y0, z0) of the origin O, and defining a beam directivity (φ, θ) of the array antenna, wherein the defining a beam directivity (φ, θ) of the array antenna comprises:
in the coordinate system (x, y, z), an included angle between a projection of the beam directivity of the array antenna on an xy plane and a positive direction of an x-axis is an angle φ, and an included angle between the beam directivity of the array antenna and an xz plane is an angle θ; and
an operation S13 of establishing a second coordinate system, using the second array unit as another point O1 in a coordinate axis, and defining coordinates (x1, y1, z1) of the another point O1.

3. The phase compensation method according to claim 2, wherein the operation S2 comprises:
an operation S21 of marking a vertical line from the another point O1 to a direction of the beam directivity of the array antenna, and obtaining an intersection point M between the vertical line and a direction line of the beam directivity of the array antenna, to determine the wave path difference OM in the direction of the beam directivity of the array antenna; and
an operation S22 of calculating the wave path difference OM based on a vertical relationship between the vector OM and a vector O1M.

4. The phase compensation method according to claim 3, wherein before the operation S1, the phase compensation method comprises:
predetermining a phase $\phi_2$ of the second array unit; and
the operation S3 comprises:
substituting the wave path difference OM and the phase $\phi_2$ of the second array unit into a phase compensation formula, to determine a phase $\phi_1$ of the first array unit, wherein the phase compensation formula is as follows:

$$\phi_1 = \phi_2 + 360 * \frac{r}{\lambda},$$

wherein r indicates the wave path difference, and λ indicates a wavelength.

5. The phase compensation method according to claim 4, wherein the phase compensation method further comprises:
deflecting the first array unit to a position of the second array unit, setting a deflected first array unit as a third array unit, and performing phase compensation on the third array unit, to obtain the phase of the first array unit by performing phase inversion on the third array unit.

6. The phase compensation method according to claim 5, further comprising:
deflecting the second array unit to a position of the first array unit, setting a deflected second array unit as a fourth array unit, and performing phase compensation on the fourth array unit, to obtain the phase of the second array unit by performing phase inversion on the fourth array unit.

7. The phase compensation method according to claim 1, further comprising:
connecting each array unit to an electronic switch, and controlling each array unit based on the electronic switch, to sequentially test a far field of each array unit.

8. A phase compensation apparatus for measuring an array antenna, wherein the array antenna comprises a first array unit and a second array unit, and the phase compensation apparatus comprises a memory storing instructions and a processor in communication in communication with the memory, wherein the processor is configured to execute the instructions to:
control to measure the first array unit and the second array unit, which are placed on a rotary table, so as to obtain measured far-field directivity patterns of the first array unit and the second array unit; and establish a coordinate system, so as to determine a spatial geometrical relationship between the first array unit and the second array unit;
determine a wave path difference between the first array unit and the second array unit based on the spatial geometrical relationship between the first array unit and the second array unit; and
perform phase compensation on the second array unit based on the wave path difference, so as to compensate a beam directivity deviation introduced to the measured far-field directivity patterns when at least one of the first array unit and the second array unit deflects from a rotation center of the rotary table.

9. The phase compensation apparatus according to claim 8, wherein the processor is further configured to execute the instructions to:
deflect the first array unit to a position of the second array unit, set a deflected first array unit as a third array unit, and perform phase compensation on the third array unit, to obtain a phase of the first array unit by performing phase inversion on the third array unit.

10. The phase compensation apparatus according to claim 9 wherein the processor is further configured to execute the instructions to:
deflect the second array unit to a position of the first array unit, set a deflected second array unit as a fourth array unit, and perform phase compensation on the fourth array unit, to obtain a phase of the second array unit by performing phase inversion on the fourth array unit.

11. The phase compensation apparatus according to claim 8, wherein the processor is configured to execute the instructions to control to measure the first array unit and the second array unit, which are placed on a rotary table, so as to obtain measured far-field directivity patterns of the first array unit and the second array unit; and establish a coordinate system based on the far-field directivity patterns, so as to determine a spatial geometrical relationship between the first array unit and the second array unit in a following manner:
exporting the measured far-field directivity patterns of the first array unit and the second array unit, to establish the coordinate system, wherein the coordinate system is represented by using (x, y, z);
establishing a first coordinate system, using the first array unit as an origin O, defining coordinates (x0, y0, z0) of the origin O, and defining a beam directivity (φ, θ) of the array antenna, wherein the defining a beam directivity (φ, θ) of the array antenna comprises:

in the coordinate system (x, y, z), an included angle between a projection of the beam directivity of the array antenna on an xy plane and a positive direction of an x-axis is an angle φ, and an included angle between the beam directivity of the array antenna and an xz plane is an angle θ; and establishing a second coordinate system, using the second array unit as another point O1 in a coordinate axis, and defining coordinates (x1, y1, z1) of the another point O1.

12. The phase compensation apparatus according to claim 11, wherein the processor is configured to execute the instructions to determine a wave path difference between the first array unit and the second array unit based on the spatial geometrical relationship between the first array unit and the second array unit in a following manner:

marking a vertical line from the another point O1 to a direction of the beam directivity of the array antenna, and obtaining an intersection point M between the vertical line and a direction line of the beam directivity of the array antenna, to determine the wave path difference OM in the direction of the beam directivity of the array antenna; and calculating the wave path difference OM based on a vertical relationship between the vector OM and a vector O1M.

13. The phase compensation apparatus according to claim 12, wherein the processor is further configured to execute the instructions to:

predetermine a phase $\phi_2$ of the second array unit; and the phase compensation module is configured to perform phase compensation on the second array unit based on the wave path difference in a following manner:

substituting the wave path difference OM and the phase $\phi_2$ of the second array unit into a phase compensation formula, to determine a phase $\phi_1$ of the first array unit, wherein the phase compensation formula is as follows:

$$\phi_1 = \phi_2 + 360 * \frac{r}{\lambda},$$

wherein r indicates the wave path difference, and indicates a wavelength.

14. The phase compensation apparatus according to claim 8, wherein the processor is further configured to execute the instructions to:

connect each array unit to an electronic switch, and control each array unit based on the electronic switch, to sequentially test a far field of each array unit.

* * * * *